United States Patent [19]

Albee et al.

[11] Patent Number: 5,548,525
[45] Date of Patent: Aug. 20, 1996

[54] METHOD AND APPARATUS FOR PIN ASSIGNMENT IN AUTOMATIC CIRCUIT TESTERS

[75] Inventors: Alan J. Albee, Nashua, N.H.; Erik Duus, Acton; Mark Ellis, Sudbury, both of Mass.

[73] Assignee: Gen Rad, Inc., Concord, Mass.

[21] Appl. No.: 580,795

[22] Filed: Dec. 29, 1995

Related U.S. Application Data

[63] Continuation of Ser. No. 48,414, Apr. 14, 1993, abandoned.

[51] Int. Cl.$^6$ .............................. G01R 1/02; G01R 1/067
[52] U.S. Cl. ........................ 364/489; 364/488; 324/755
[58] Field of Search .............................. 364/489, 488; 324/754, 755, 73.1

[56] References Cited

U.S. PATENT DOCUMENTS 4,746,855  5/1988  Wrinn ................................ 324/158 R
5,032,789  7/1991  Firooz et al. ...................... 324/158 R
5,231,589  7/1993  Itoh et al. .............................. 364/490

Primary Examiner—Vincent N. Trans
Attorney, Agent, or Firm—Cesari and McKenna

[57] ABSTRACT

The wiring of system contacts (18) to board probes (20) on a fixture (16) that is used to connect nodes of a board under test to system pins (14) of a multiplexed circuit tester (10) is performed independently of test generation for the type of circuit board with which the fixture (16) is associated. Conflict lists that the pin-assignment program uses to determine which system contacts to wire to which board probes are generated without using the output of the program for generating the board test. For driver/sensor probes, a conflict list for the in-circuit test of a given device includes all input and output nodes of that device as well as all input nodes of devices whose output terminals are connected to nodes of the device under test. The resulting wiring results in few conflicts without requiring many more tester resources than conventional pin-assignment approaches do, and it can be employed without adding to manufacturing lead time.

10 Claims, 5 Drawing Sheets

METHOD AND APPARATUS FOR PIN ASSIGNMENT IN AUTOMATIC CIRCUIT TESTERS

This application is a continuation of the application Ser. No. 08/048,414, filed Apr. 14, 1993, now abandoned.

BACKGROUND OF THE INVENTION

The present invention is directed to automatic circuit testing and in particular to designing fixtures employed in such testing.

FIGS. 1 and 2 depict a typical automatic-circuit-testing arrangement. An automatic tester 10 applies signals to predetermined points on a circuit board under test 12 and senses the resultant signals at other points. The signals are sent from and received at system terminals 14, which are physically arranged in an array in which the terminal positions are generally independent of the configuration of any individual board to be tested; the tester is intended for use with many types of boards, which must be probed at different places for the proper test. Accordingly, a fixture 16 makes electrical connections between the system-pin positions and the positions of the nodes on the board at which the signals are to be introduced or sensed during the test.

The fixture has system pins 18 so positioned as to enable them to contact a plurality of the system terminals 14 simultaneously, and it also has a plurality of board probes 20 so positioned as simultaneously to contact all of the board nodes at which signals are to be introduced or sensed. The fixture 16 also includes conductors 22 that make the connections between board probes and corresponding system pins.

In operation, a system terminal 14 is connected to, for instance, a driver-sensor 24 or 26, which acts to provide the required stimulus test signal or to sense whether the expected response signal occurs. Instructions for testing of complicated circuit boards take the form of sequences of "vectors," whose components are the logic values applied at or tested for at respective nodes on the board under test. Test-generation programs receive as inputs the board topology and library entries that describe the functions performed by the devices on the board. In response, they produce tests that will propagate to device outputs the symptoms, or "fault effects," of the various faults that the test must be able to detect. Clearly, determination of the series of vectors that will reveal all such faults is not trivial, but test-generation programs have been developed and perform this function more or less routinely.

In the hardware for applying the test vectors, some testers employ a multiplexed arrangement, in which switches 25 selectively connect system resources, such as driver-sensors 24 and 26, to different system pins 14 during different in-circuit tests. The idea of multiplexing arises from the fact that so-called in-circuit testing of complex circuit boards requires a large number of system terminals 14 (or "pins," as they are often called, although they are not in principle required to be elongated in shape). In-circuit testing is the testing of individual components, or groups of them, in their place on the board without testing the function of the entire board. Because a complex board may have many components, most of which need to be subjected to respective in-circuit tests, the number of system pins 14 must be correspondingly large. However, it is not necessary for the tester to include so large a number of system resources, because only a fraction of the pins are active in any single in-circuit test. Multiplexed testers thus tend to be much less expensive than non-multiplexed testers, which must have as many tester resources as there are nodes to be tested.

Clearly, positioning the probes 20 and wiring the conductors 22 must be performed separately for each different type of board to be tested. Although not as complicated as are many of the tasks involved in testing of complex electronic circuits, the provision of such a custom-built fixture presents certain complications when the tester is of the multiplexed variety.

In principle, multiplexing the tester resources does not have to affect the fixture design. In practice, however, it usually does because the switches 25 are ordinarily arranged in a "sparse matrix." In a sparse matrix, any given tester resource, such as driver-sensor 26, is connectable to only a small subset of the pins 14: it is connectable only to the pins in an associated group 30. Conversely, the pins in group 30 are connectable only to driver-sensors 24 and 26: they cannot be connected to other driver-sensors, such as driver-sensors 31 and 32. This situation can give rise to "conflicts" if the correspondence between system contacts 18 and board-side contacts 20 is not chosen judiciously.

To understand the manner in which a conflict can arise, let us suppose that the board nodes contacted by probes 20a and 20b of FIG. 2 must both be driven during the in-circuit test of component U1 and that the fixture 16 is so wired as to connect these probes to the system contacts 18 opposite system pins 14a and 14b. Further suppose that board-side contacts 20a and 20c must both be driven during the in-circuit test of component U2 and that the fixture 16 wires probe 20c to the system-side contact 18 opposite pin 14c. Both of the pin assignments by themselves are acceptable; although pins 20a and 20b would ordinarily have to be separately driven during the in-circuit test of U1, and although pins 20a and 20c would have to be separately driven during the in-circuit test of U2, it is within the tester's capabilities to do so, since the switch matrix 25 can be placed in such a state that driver-sensor 24 is connected to one of those pins while driver-sensor 26 is connected to the other.

But now suppose that the in-circuit test of circuit component U3 requires that probes 20a, 20b, and 20c be driven simultaneously but independently. Driving of board-side contact 20a may be necessary, for instance, to inhibit U2 from applying the U3 a signal inconsistent with that which the tester attempts to apply by means of board-side contact 20c. This results in a conflict with the previous assignment of tester resources (system pins 14a–c) to test nodes 20a–c for the in-circuit tests of components U1 and U2.

To avoid such conflicts, pin-assignment programs are conventionally employed that receive as inputs specifications of the in-circuit tests to be applied to all components on the board. From those test specifications, the pin-assignment program compiles "conflict lists," which are not lists of conflicts but instead are sets of board probes that must be active simultaneously. In ways not relevant here, the pin-assignment program proceeds to find a set of correspondences between board probes and system contacts that, for every conflict list, enables the tester to operate all probes on the list simultaneously. It is only after the pin-assignment program has been run that fixture wiring can begin, and, although not as time-consuming as some other tasks involved in preparing for the manufacture of a product, the length of time that fixture wiring does take can be critical, since it comes at the end of the process. For this reason, some manufacturers invest in non-multiplexed testers, despite their higher cost, in order to avoid the extra delay occasioned by the need to avoid wiring conflicts.

SUMMARY OF THE INVENTION

We have developed a way of enabling a manufacturer to use a multiplexed tester without suffering the delay that the pin-assignment process conventionally requires. Our method is a result of our realization that the pin-assignment process can be performed without knowing the test that will ultimately be applied to the board. In one embodiment, for instance, we supply to the pin-assignment program conflict lists that include all probes that are to be operated by driver-sensors and contact input or output nodes of the device under test or input nodes of "neighbor" devices, which themselves potentially drive the device under test. Probes that are dedicated only to driving or only to sensing are similarly included, with the exception that drive probes that do not contact any of those input nodes will ordinarily be excluded, as will sense probes that do not contact a device-under-test output node. Additionally, if the system has resources that are not multiplexed and certain probes are known to be dedicated to their use, those probes need not be included in the conflict list, even though they are connected to input or output nodes of the device under test.

BRIEF DESCRIPTION OF THE DRAWINGS

The above and further advantages of the invention may be better understood by referring to the following description in conjunction with the accompanying drawings, in which.

DETAILED DESCRIPTION OF AN ILLUSTRATIVE EMBODIMENT

Figure 1:
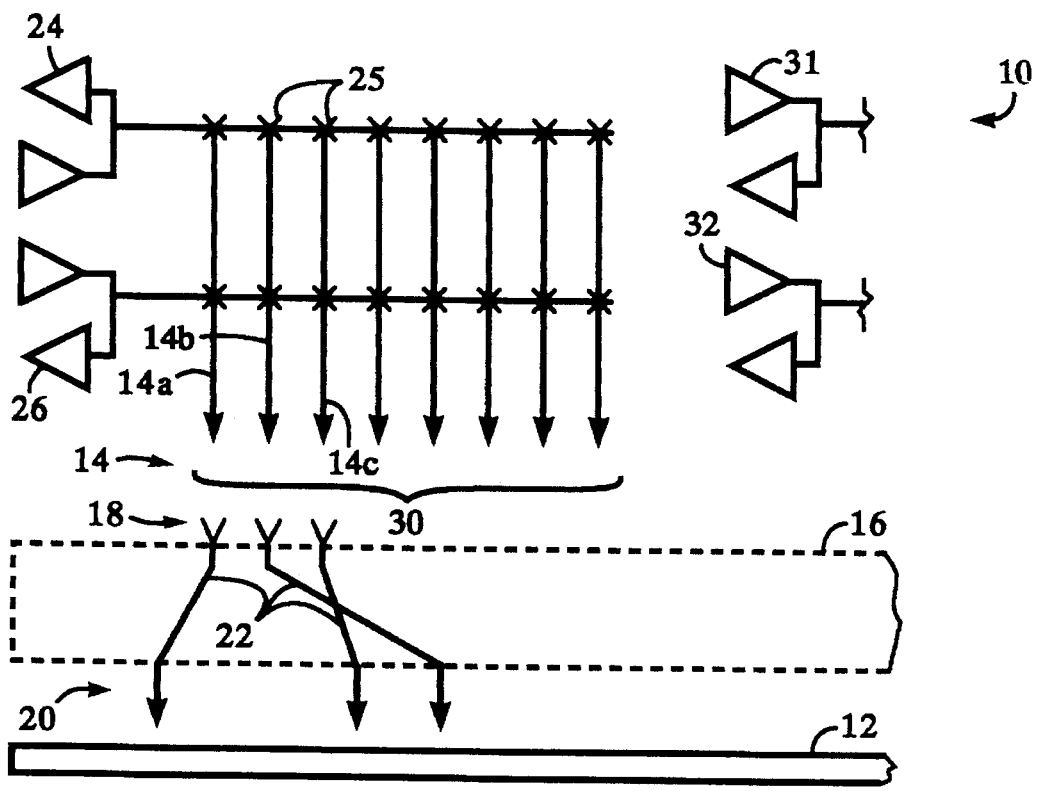
FIG. 1 is a schematic diagram of system resources in a multiplexed tester and a fixture used for a particular board type.
Figure 2:
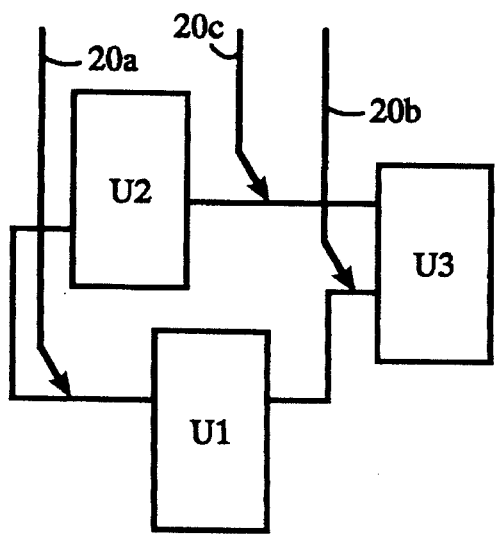
FIG. 2 is a schematic diagram of a board of the type for which the fixture of FIG. 1 is designed.

To explain the advantages of the present invention, we first describe the procedure conventionally employed to produce a fixture for in-circuit testing when a multiplexed tester is used. Initially, of course, the board-design process 33 (FIG. 3) must be completed. The result of this process will be a circuit description 34, which can be thought of as representing the information of FIG. 2. That is, it includes a list of the devices such as U1, U2, and U3 of FIG. 2 together with the topology by which they are interconnected and the locations at which probes are to contact the board. The design process will in many cases specify that certain probes will be dedicated to driving, since certain testers include resources such as clock drivers, which are particularly fast drive circuits used for clock-signal generation. Other probes will be designated ordinary driver/sensor probes, and some may be designated sensor-only probes. Additionally, the intended tester, although largely multiplexed, may have certain non-multiplexed resources, and the board-design process may designate certain probes as being dedicated to use by such non-multiplexed resources.

In any event, the circuit description 34 that results from the board-design process contains the intended probe layout 35, which includes enough information that mechanical assembly of the fixture can proceed. The physical layout of the system pins will be known a priori, so a fixture frame containing the system contacts in the necessary arrangement may already be available, and it is possible to position the system probes properly from the probe layout 35. An unwired fixture 38 having board probes on one side and system contacts on the other can therefore be produced. For non-multiplexed testers, the electrical wiring between the system contacts and the board probes is also performed at this point.

For multiplexed testers, however, it has been necessary first to perform the complicated test-generation step 40. Test generation, as was mentioned above, is relatively complex, requiring as it does the need to determine how to propagate the effects of tested-for faults to nodes at which those effects can be detected. This requires knowledge of the board devices' inner workings. Much of this information can be obtained from a device library 42, which typically contains this information for a large number of commonly employed devices. All too often, however, the board will include devices for which entries are not yet in the device library, either because the device manufacturer has not yet disseminated that information or because the device is a custom chip, such as an application-specific integrated circuit or programmable read-only memory, for which the board or test designer must laboriously enter the device-characterizing information into the test-generation process 40. Moreover, some board layouts confound automatic test generation, so laborious "manual" test generation becomes necessary.

The test-generation process therefore is often quite time-consuming, but fixture wiring has conventionally had to await its completion so that it could be known what sets of probes were simultaneously active. That is, it was only after the test generator had produced the in-circuit circuit test program 44 that a conflict-list-extraction step 46 could produce the conflict list 48 that the pin-assignment program 50 needs to generate pin assignment 52. By this time, however, it often occurs that all is ready for production except the fixtures which now must be hurriedly wired in step 54 to produce a completed fixture 56. In short, these final steps of fixture wiring, although not as time-consuming as test generation 40 and some other processes required to bring the board to market, tend to come at a critical point and increase lead time.

Figure 3:
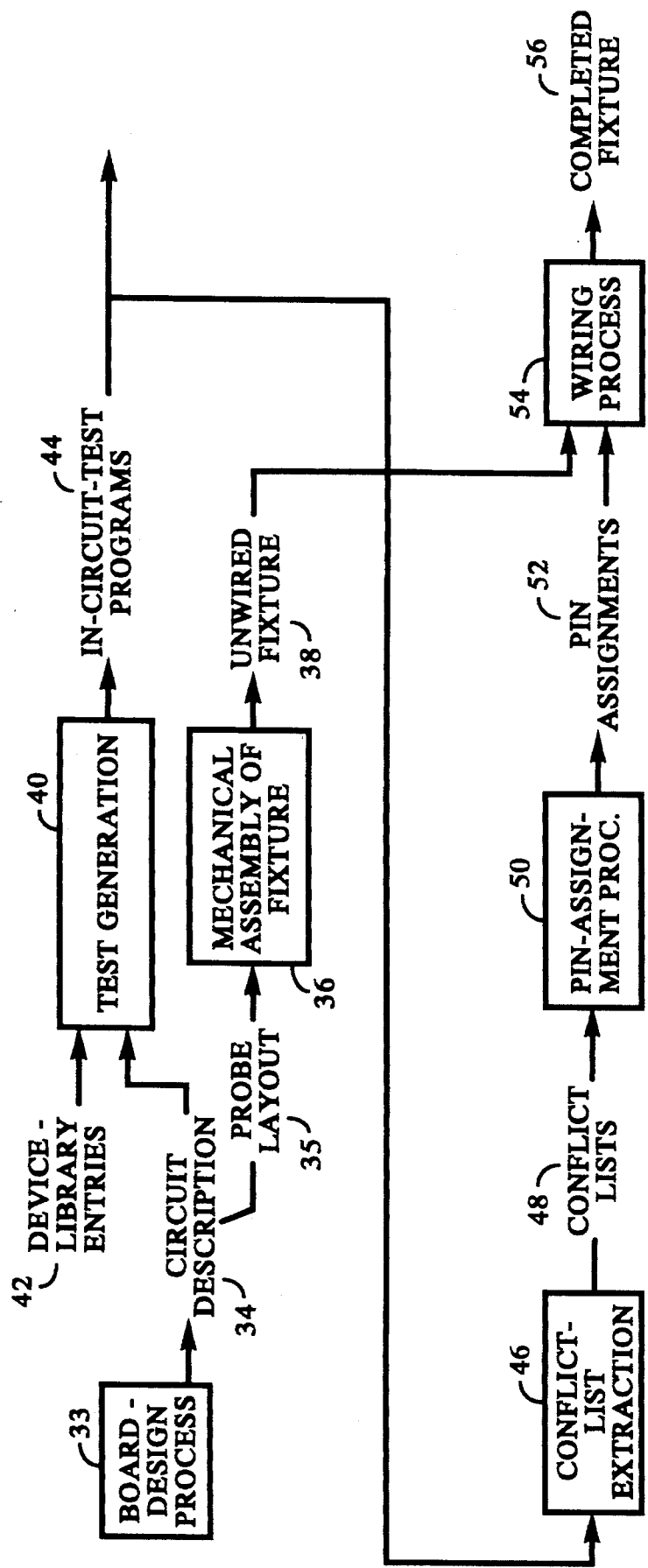
FIG. 3 is a flow chart of a conventional fixture-design process.
Figure 4:
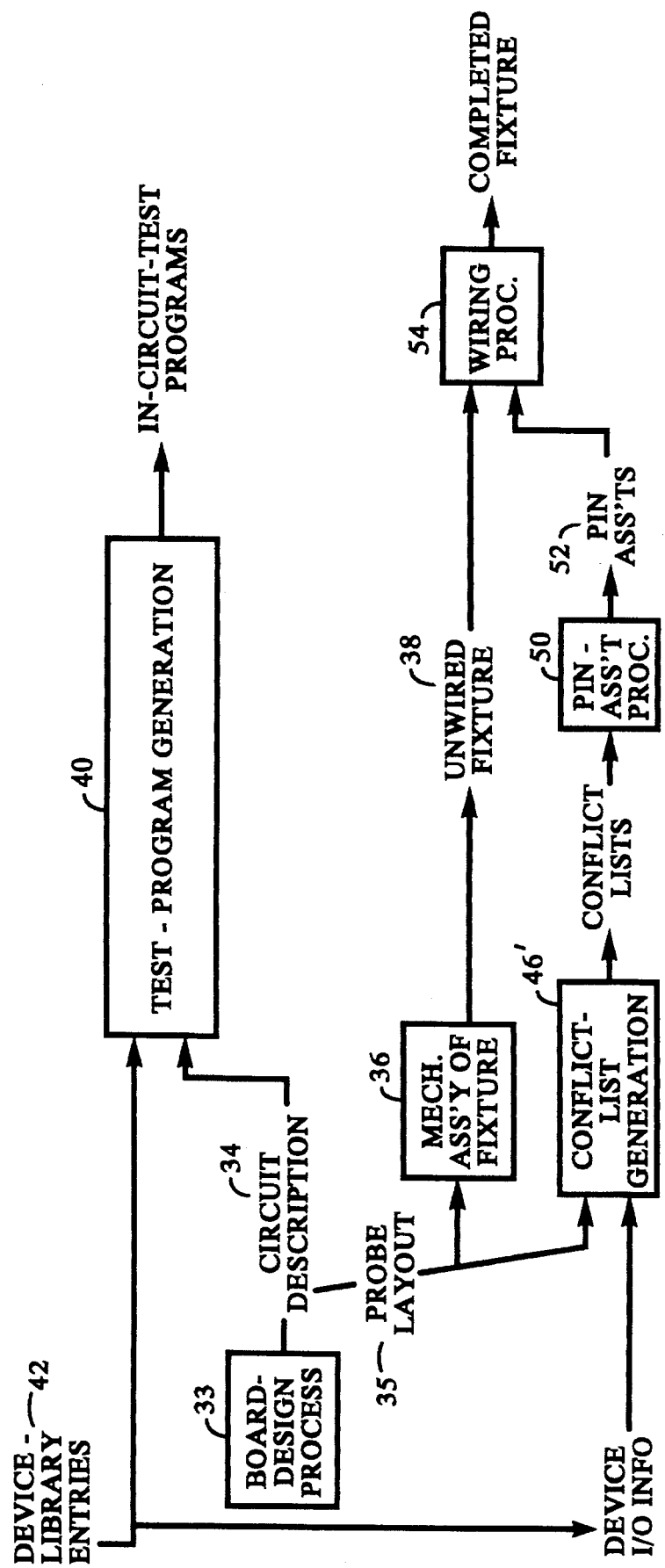
FIG. 4 is a similar flow chart of the fixture-design process of the present invention.

In contrast, the present invention proceeds as depicted in FIG. 4, in which elements similar to those in FIG. 3 have identical reference numerals. As FIG. 4 shows, most of the steps are essentially the same, but a new type of conflict-list generation 46' is employed, which operates independently of the in-circuit test program so that the fixture wiring can proceed concurrently with test generation. As a consequence, fixture wiring would not ordinarily delay manufacturing, since it usually takes considerably less time than test generation 40.

Figure 5A:
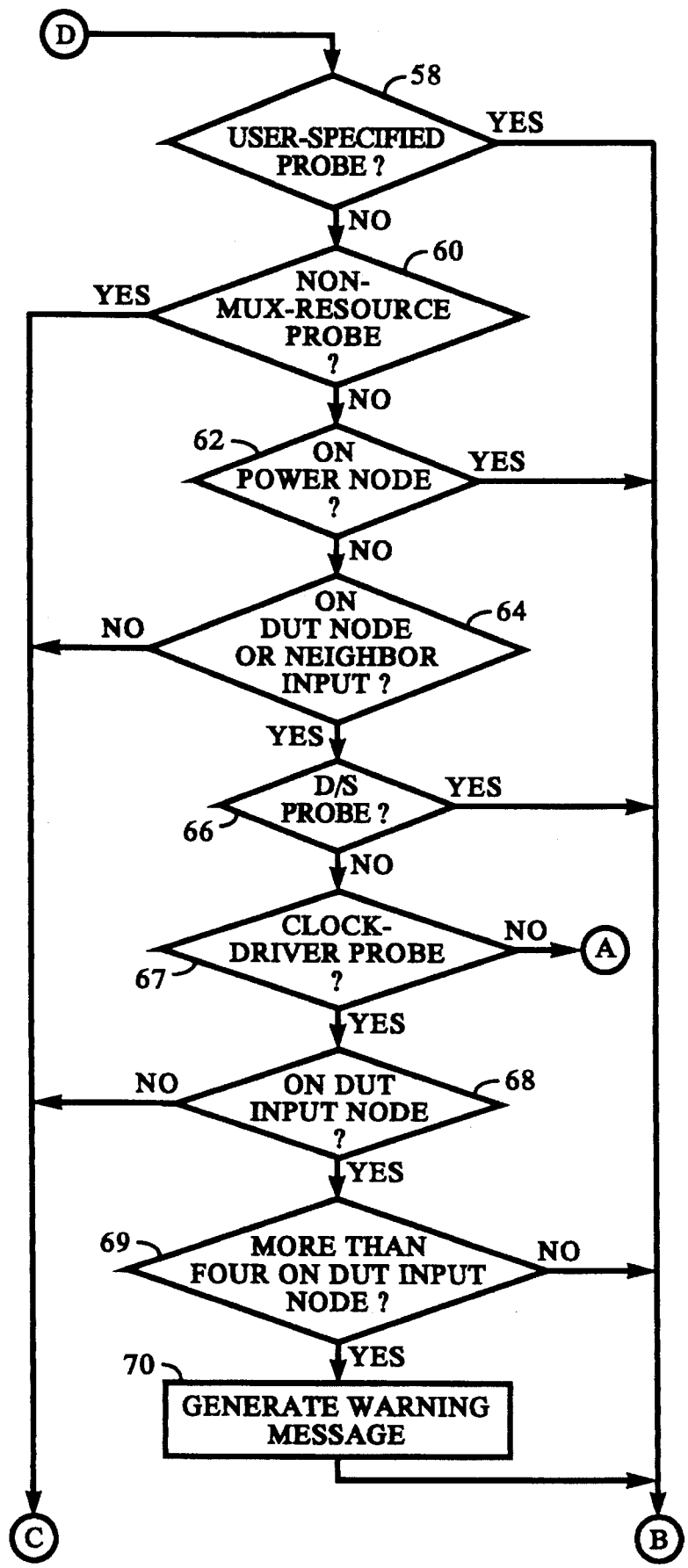
FIGS. 5A and 5B together form a flow chart of the conflict-list generation process used in the present invention.
Figure 5B:
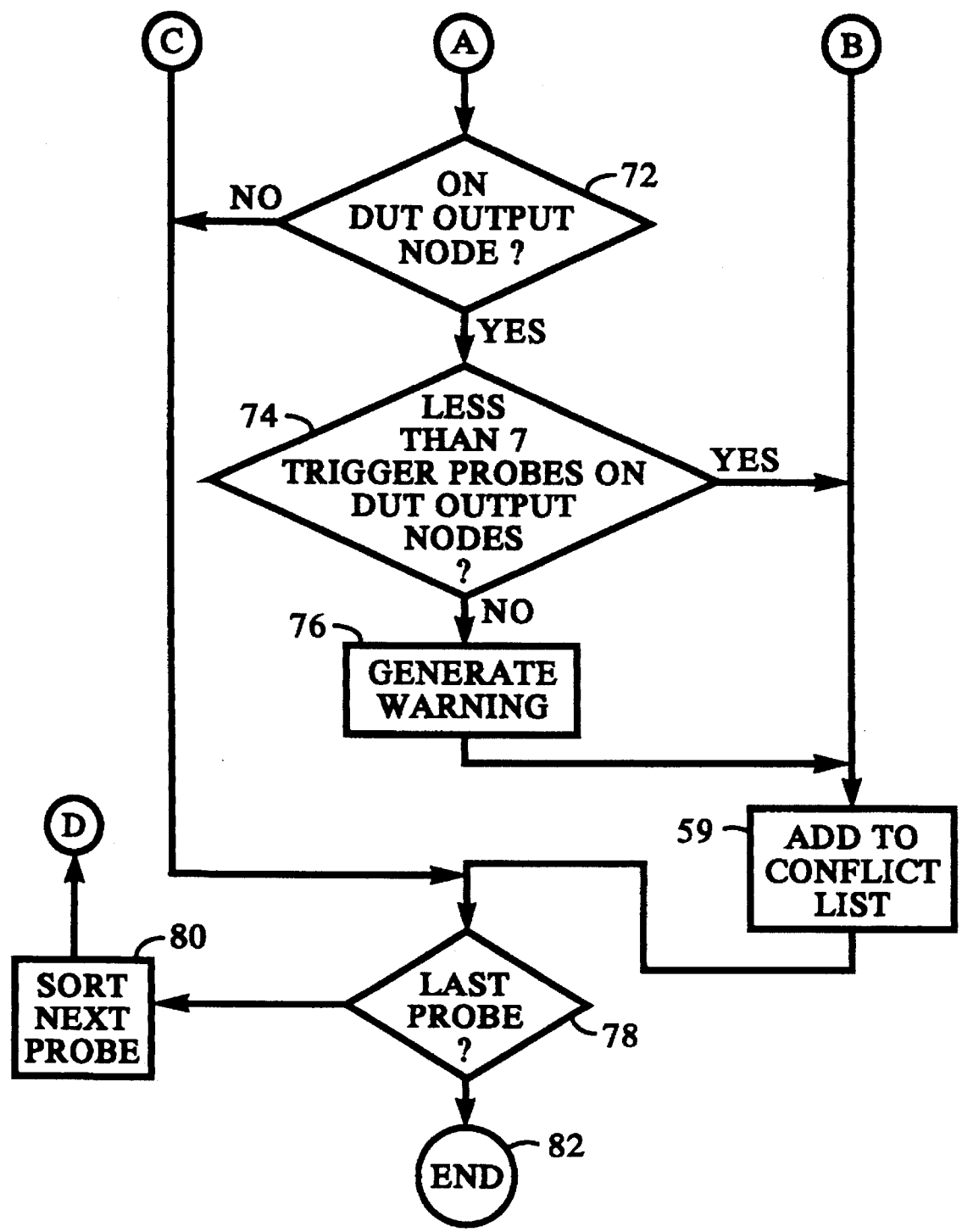

The step of conflict-list generation will depend somewhat on the particular tester with which the method is employed, but FIGS. 5A and 5B depict a representative approach. It should be understood that a "device," although ordinarily a single chip, may sometimes be a cluster of them, which are considered a single device for purposes of certain tests. It should also be understood that some tests actually are performed on a plurality of identical devices simultaneously, in which case the routine of FIGS. 5A and 5B is performed for each, and the resulting conflict lists are then merged.

For a given device under test, the conflict-list-generation routine may start with an optional file, generated by the user, that lists some probes whose use during the test is known to be required. Of course, it is the purpose of the routine of FIGS. 5A and 5B to do this itself, but it is sometimes desirable for the human user to be able to incorporate high-level knowledge into the process. For instance, noise-suppression considerations may make it beneficial to disable a board's on-board crystal clock even though the clock is topologically remote from the device under in-circuit test. Operating primarily from connection information, the conflict-list generator of FIGS. 5A and 5B would not recognize the need to allocate one or more probes to that function during the in-circuit test. Indeed, even the test-generation program 40 of FIGS. 3 and 4 would not ordinarily include such an operation in the test without human intervention. So an optional file containing results of high-level user knowledge may be provided, and the step of block 58 accordingly determines whether the probe is one that the user has specified. If so, it is added to the conflict list, as block 59 (FIG. 5B) indicates.

Otherwise, the routine proceeds to a step represented by block 60, in which it determines whether the board-design process, and in particular the resultant circuit-description file 34, has identified the particular probe as being one that is to be dedicated to operation by a non-multiplexed resource. A positive result of this test excludes the probe from the conflict list.

If the result is negative, the routine determines whether the probe contacts a power node (e.g., $V_{cc}$ or ground), as block 62 indicates. In the illustrated embodiment, all such probes are included in every conflict list, although this is not necessary to the present invention and in fact results in some tester-resource use that in one sense is not necessary. We believe that it is a desirable step to take, however, for purposes that will be discussed below.

If the probe is not on a power node, a test represented by block 64 is performed to determine whether the probe contacts a node connected to a terminal of the device under test or to an input terminal of a "neighbor." By neighbor, we mean a device having an output terminal connected to the device under test. Sometimes information concerning whether some devices' terminals are input or output pins is not yet available. Such a device will be considered a neighbor if any terminal is connected to the device under test, and a positive outcome of the block-64 test results if the probe in question is on a node connected to any terminal of that device. Conversely, it sometimes occurs that the available model information for a device indicates no use for a given physical terminal, and, if it becomes necessary to conserve tester resources, the routine may exclude from consideration such terminals on the device under test and thereby eliminate from "neighbor" status any devices connected to the device under test only by an unused terminal. If the test-64 result is negative, the probe is excluded from the conflict list, but the routine proceeds on a positive result to step 66, in which the routine determines whether the probe has been designated a driver/sensor probe. If so (or if the board-design process has not resulted in a designation of what type of probe it is), the probe is added to the conflict list.

Otherwise, the routine proceeds to step 67, which determines whether the probe has been designated a clock-driver probe. As was mentioned above, such probes are dedicated to operation by drivers, so the presence of such a probe on the output node of the device under in-circuit test does not suggest that the probe will be part of the in-circuit test of that device. Moreover, clock drivers are not used in inhibiting operations of neighboring devices. So a positive result of test 67 causes a test 68 to determine whether the probe is located on an input node of the device under test. Probes on such input nodes are added to the conflict list, and those that are not are excluded. But the tester for which the routine of FIGS. 5A and 5B is employed has the capacity for only four separate simultaneous clock drivers. The existence of more than that many probes for which the outcome of test 67 is positive therefore indicates a potential problem, so the routine generates a warning in such a situation, as blocks 69 and 70.

In such a tester, a negative result of test 67 means that the probe is a trigger probe, which is dedicated to operation by a resource used to trigger tester operations in response to receipt of certain signals from the board under test. In a step represented by block 72, the routine therefore determines whether the probe is to contact an output node of the device under test. If so, it is added to the conflict list after steps represented by blocks 74 and 76, in which the routine determines whether the trigger resources have been exhausted and generates a warning if they have.

After a determination has been made of whether a probe should be included in a conflict list, the procedure is repeated for the next probe, as blocks 78 and 80 indicate. This continues until all probes have been considered and the routine ends in a step represented by block 82.

Clearly, this conflict-list-generation program is not as efficient as it could be if it had the benefit of the test-generation output: it tends to include more probes in the conflict lists than are necessary. This results in a compromise of the advantage that multiplex testers afford; that is, more tester resources—and thus potentially more driver-sensor boards in the tester—may be required for this method than for the conventional method, in which the output of the test-generation step is used to determining pin assignments. As was mentioned above, though, the penalty of the conventional approach is that it extends the lead time required for manufacture. Moreover, the advantage in tester-resource use that the conventional approach yields is not great. Although there are "pathological" cases for which the method of the present invention does result in considerably greater resource usage than the conventional method does, our studies have indicated that, for a two-thousand-node board, it is more typical for our method to yield only on the order of about fifty more unused pins than conventional methods do, and the number in some cases is much less than that.

It is also true that the present invention sometimes misses a conflict and thus results in a small amount of rewiring, but the resultant delay tends to be small. Moreover, rewiring can result from conventional methods, too: it is often necessary to debug a test produced by the test-generation step, and this can necessitate rewiring regardless of the method of pin assignment employed.

Additionally, it turns out that the illustrated embodiment of our method tends to result in less need for rewiring than conventional methods do in such situations. This is a beneficial result of our slightly larger conflict lists, and it is the reason why the illustrated embodiment forces probes that contact power nodes to be included in all conflict lists. This requirement makes the resultant wiring arrangement less likely to require changing as a result of changes in the test that result from the debugging process.

It is thus apparent that the present invention constitutes a significant advance in the art.

We claim:

1. A method of making electrical connections between board probes and system contacts of a test fixture associated with a given type of circuit board that includes board components to be tested, the test fixture including board probes so positioned with respect to each other as to enable them simultaneously to contact predetermined test nodes respectively associated therewith on a circuit board of the given circuit-board type, the test fixture also including a corresponding plurality of system contacts so positioned with respect to each other as to enable them simultaneously to contact respective system pins associated therewith in a multiplexed automatic circuit tester that includes system resources and the system pins, which are organized into pin groups, in each of which less than all of the pins in the pin group can be connected to separate system resources simultaneously, the method comprising the steps of:
   A) generating, independently of the results of test generation for the circuit-board type, a conflict list for each of a plurality of board components to be tested;
   B) employing the lists thus generated as inputs to a pin-assignment program to generate connection lists that pair board probes with system contacts; and
   C) wiring the board probes to the system pins in accordance with the connection lists.

2. A method as defined in claim 1 wherein:
   A) at least a subset of the board probes are designated driver/sensor probes during the process of designing the circuit-board type with which the fixture is associated; and
   B) at least one of the conflict lists includes every driver/sensor probe associated with an input node or output node of the board component for which the list is generated and further includes every driver/sensor probe associated with an input node of a board component having an output terminal connected to an input or output node of the board component for which the list is generated.

3. A method for producing a fixture for connecting test nodes of one or more board components under test on a circuit board with system pins of a multiplexed circuit tester, the fixture including board probes configured to simultaneously contact predetermined test nodes respectively associated therewith on the circuit board, and system contacts configured to simultaneously contact predetermined system pins respectively associated therewith on the circuit tester, the method comprising the steps of:
   1) generating in-circuit test programs;
   2) generating, independently of said step 1), a conflict list for each of the one or more board components under test;
   3) determining pin assignments utilizing said conflict list; and
   4) wiring the board probes to the system contacts in accordance with said pin assignments.

4. The method of claim 3 further comprising the steps of:
   5) before said step 1), performing a board design process to generate a circuit description for use in said step 2).

5. The method of claim 4 wherein for a selected probe, said step 2) comprises the steps of:
   a) determining whether said circuit description has identified said selected probe as being dedicated to operation by a non-multiplexed resource;
   b) determining whether said selected probe contacts a power node if said selected probe is not dedicated to operation by a non-multiplexed resource;
   c) when said selected probe is not connected to a power node, determining whether or not said selected probe contacts a node that includes a terminal of the board component under test or an input terminal of a board component having an output terminal connected to the board component under test;
   d) determining whether said circuit description has identified said selected probe as being designated a driver/sensor probe;
   e) determining whether said circuit description has identified said selected probe as being designated as a clock-driver probe;
   f) determining whether said selected probe is located on output node of the board component under test when said selected probe is not designated as a clock-driver probe;
   g) determining whether said selected probe is located on an input node of said board component under test when said selected probe is designated as a clock-driver probe;
   h) adding said selected probe to said conflict list when said selected probe is determined to contact said power node, said input node, or said output node of the board component under test; and
   i) adding said selected probe to said conflict list when said circuit description designates said selected probe as a driver/sensor probe, or a clock-driver probe.

6. The method of claim 5 further comprising the step of:
   j) adding user-specified probes to said conflict list.

7. The method of claim 6 wherein said multiplexed circuit tester is configured specifically for a given type of circuit board to be tested.

8. The method of claim 7 wherein said device under test includes one or more integrated circuits.

9. The method of claim 5 wherein said step 2) is simultaneously performed on a plurality of said one or more board components under test to produce a plurality of conflict lists.

10. The method of claim 9 wherein said plurality of conflict lists are merged to produce an integrated conflicts list.

* * * * *